United States Patent [19]

Harms et al.

[11] Patent Number: 5,125,407
[45] Date of Patent: Jun. 30, 1992

[54] METHOD FOR MAGNETIC RESONANCE IMAGING OF AN OBJECT

[75] Inventors: Steven E. Harms, Dallas; Duane P. Flamig, Richardson, both of Tex.

[73] Assignee: Baylor Research Foundation, Dallas, Tex.

[21] Appl. No.: 484,119

[22] Filed: Feb. 23, 1990

[51] Int. Cl.$^5$ .............................. A61B 5/055
[52] U.S. Cl. ................... 128/653.2; 324/309
[58] Field of Search .................... 128/653 A; 324/309

[56] References Cited

U.S. PATENT DOCUMENTS

| | | | |
|---|---|---|---|
| 4,613,949 | 9/1986 | Glover et al. | 324/309 |
| 4,699,148 | 10/1987 | Gyngell | 128/653 A |
| 4,707,658 | 11/1987 | Frahm et al. | 128/653 A |

OTHER PUBLICATIONS

Jens Frahm et al., "Rapid Three-Dimensional MR Imaging Using the FLASH Technique", *Journal of Computer Assisted Tomography*, 10(2); 363-368 (1986).

A. Haase et al., "FLASH Imaging. Rapid NMR Imaging Using Low Flip-Angle Pulses", *Journal of Magnetic Resonance*, 67, 258-266 (1986).

Harms and Muschler, "Three-Dimensional MR Imaging of the Knee Using Surface Coils", *Journal of Computer Assisted Tomography*, 10(5): 773-777 (1986).

C. Sherry et al., "Spinal MR Imaging: Multiplanar Representation from a Single High Resolution 3D Acquisition", *Journal of Computer Assisted Tomography*, 11(5): 859-862 (1987).

Charles E. Spritzer et al., "MR Imaging of the Knee: Preliminary Results with a 3DFT GRASS Pulse Sequence", *American Journal of Roentology*, 150: 597-603 (1987).

Robert L. Tyrrell, "Fast Three-Dimensional MR Imaging of the Knee: Comparison with Arthroscopy", *Radiology*, 166: 865-872 (1988).

Allan M. Haggar et al., "Meniscal Abnormalities of the Knee: 3DFT Fast-Scan GRASS MR Imaging", *American Journal of Roentology*, 150: 1341-1344 (1988).

*Primary Examiner*—Ruth S. Smith
*Attorney, Agent, or Firm*—Johnson & Gibbs

[57] ABSTRACT

Method for imaging the interior of a three dimensional object. A non-selective composite hard RF pulse is generated in the presence of a uniform magnetic field. Phase encoding pulses are generated along the first and a third axis, respectively, and a frequency encoding pulse comprised of a de-phasing portion and a re-phasing portion is generated along a second axis. During the re-phasing portion of the frequency encoding pulse, an asymmetrical fractional gradient echo containing information related to the object being imaged is produced. A next asymmetrical fractional gradient echo is then produced for next phase encoding pulses along the first and third axes. After an asymmetrical fractional gradient echo is produced for all phase encoding pulses, an image of the object is produced from the series of produced asymmetrical fractional gradient echoes.

34 Claims, 4 Drawing Sheets

METHOD FOR MAGNETIC RESONANCE IMAGING OF AN OBJECT

BACKGROUND OF THE INVENTION

1. Field of the Invention

The invention relates to magnetic resonance imaging and, more particularly, to a method for producing an image of an object from a gradient echo pulse sequence produced in response to a non-selective composite hard RF pulse.

2. Description of Related Art

Magnetism results from the motion of electric charges such as electrons. Electrons can produce a magnetic field either by motion along a path or by virtue of their intrinsic spin. The particles that comprise the atomic nucleus, collectively called nucleons, also have spin and magnetic moment. Because both individual nucleons and nuclei have a charge distribution, rotation or spin of this charge produces a magnetic dipole whose value is called a magnetic moment. The numeric value of the magnetic moment determines the energies of the different orientations of a nucleus in an external magnetic field. The proton is positively charged and has a relatively large magnetic moment. Although neutral, the neutron also has a net magnetic moment. The neutron's magnetic moment is about two-thirds the value of the protons and points against the axis of spin. When in the nucleus, like nucleons align with their spins pointing against each other. This phenomenon is called pairing and is favored because it leads to a lower nuclear energy state. Therefore, only the unpaired, odd proton or neutron, or both, contribute their magnetic moment to the nucleus. As a consequence, only nuclei with odd numbers of protons or neutrons, or both, have a magnetic moment. The magnetic properties of nuclei become important when they are placed in external magnetic fields, as the nuclei will have a tendency to align with the external field.

Resonance occurs when an amount of energy equal to the difference of energy associated with the transition between states is absorbed or released. In the case of a magnetic moment of the nucleus, transitions between parallel or "up" and anti-parallel or "down" states can occur if the correct amount of energy is absorbed or released. Because the interaction is with a magnetic element, the necessary energy can be provided by a magnetic field. One way to obtain such a field is by utilizing electromagnetic radiations. To induce resonance, the frequency f of the electromagnetic radiation must be proportional to the local magnetic field $H_L$. The particular proportionally constant which will induce resonance varies depending on the particular nucleus involved. The relationship between frequency and field is given by $$f = (gamma) H_L / 2 (pi) \tag{1}$$

where (gamma) is the magnetogyric ratio of the nucleus.

When the nuclei, originally in equilibrium with the field, are irradiated at the resonant frequency, the nuclei can adopt the anti-parallel state. When they return to equilibrium, if the field is unchanged, they will radiate emissions of the same frequency. If between excitation and radiation the field strength is changed, they will radiate at a frequency corresponding to the new field value. The behavior of nuclei may be described by a net magnetization vector M which characterizes the system by disregarding the state of each nucleus and considers only the net collective effect. In a magnetic field, the magnetization vector points along the field, its length proportional to the number of nuclei in the sample and to the field strength and inversely proportional to temperature. The length and direction of this vector characterized the equilibrium magnetization of the sample; that is, the state that it will revert to after being disturbed if enough time is allowed to pass. This equilibrium magnetization is given by $$(mu)^2 H / kT \tag{2}$$

where:
(mu) is the nuclear magnetic moment;
k is Boltzmann's constant; and
T is the absolute temperature.

The vector can be disturbed from equilibrium by application of a second external magnetic field. If such a field is superimposed upon the first magnetic field, M will align with the new net field. As M moves to its new direction, energy stored in the nuclei of the sample is provided by the second field. When the superimposed field is removed, M returns to equilibrium and the nuclei release the stored energy to the environment, either as heat or RF energy. These two fields are called the transverse field and the longitudinal field, respectively. More specifically, the component of M that points along the main field is called the longitudinal magnetization ($M_L$) and the orthogonal component is called the transverse magnetization ($M_T$). If the transverse field is an RF field at the resonant frequency, M behaves as a top, so that as it deviates from the longitudinal axis, it precesses about it. If the main magnetic field is defined as being aligned along the z axis, then $M_T$ rotates in the x,y plane and $M_L$ is reduced from its equilibrium value. If M is rotated onto the x,y plane by a 90 degree RF pulse, $M_L$ is zero. Immediately after a RF irradiation, $M_L$ begins to grow again towards its equilibrium value M. The growth is exponential with a time constant T1 so that $$M_L = M[1 - \exp(-t/T1)] \tag{3}$$

where t is the time since irradiation.

During this process, $M_T$ decays exponentially with a time constant T2, so that $$M_T = M_{T0} \exp(-t/T2) \tag{4}$$

where $M_{T0}$ is the value of $M_T$ immediately after irradiation and t is the lapse time.

When a proton is aligned with the magnetic field, it gives off no signal. When a proton is perpendicular to the field, it gives off a maximum signal. The rate at which a proton realigns with the static field is called its "T1" or "T1 relaxation time". The T1 rlaxation time is also called spin-lattice or thermal relaxation time. The individual protons exchange fixed amounts of energy when they flip from the down to up alignment in the process of returning to equilibrium. This exchange can occur only at the resonant frequency. A molecule in the lattice surrounding the resonant nucleus appears as an oscillating electric and magnetic field with frequency that depends on its thermal velocity and mean free path. Since both vary over a broad range for any one temperature, of the whole ensemble of molecules only a small fraction provide the right oscillating fields. These then couple to the nucleus and allow the relaxation to occur. As temperature and molecular composition changes, so does the distribution of velocities and mean free paths, thus affecting T1.

When a group of protons precess in phase, the voxel gives off a maximum signal. When a group of protons precess out of the phase, the voxel gives off no signal. The rate at which the protons de-phase is called its "T2" or "T2 relaxation time". The T2 relaxation time is also called the spin-spin or transverse relaxation time. In a perfectly uniform magnetic field, all nuclei will resonate at exactly the same frequency. But if the field is even slightly inhomogeneous, nuclei resonate at slightly different frequencies. Although immediately after a RF irradiation they are all in phase, they soon lose coherence and the signal that is observed decays. Any loss of coherence shortens T2. The effects due to inhomogeneities and the external field produce a rapid decay characterized by the relaxation time T2.

Magnetic resonance has become an established method for producing an image of the interior of an object. Such method have numerous applications, particularly in medical diagnostic techniques such as the diagnosis of internal derangements of the knee. Most magnetic resonance techniques for knee imaging use a two dimensional (or "2D") acquisition with a spin-echo pulse sequence to provide T1, T2 and proton density weighted images of the knee in multiple planes, typically the sagittal (y-z) and coronal (x-z) planes. However, obtaining images in non-orthogonal planes is often advantageous for diagnosing internal derangements of the knee. For example, directly acquired oblique views of the anterior cruciate ligament and radial scans of the menisci have provided additional diagnostic information that was not available from the conventional views. However, to obtain images in a non-orthogonal plane, the use of two gradients rather than a single gradient are required to obtain a slice. Furthermore, oblique plane imaging of an object requires a corrective procedure after obtaining each gradient echo to keep the slices passing through the object being imaged.

As an alternative method for directly acquiring multiple image planes, a three dimensional (or "3D") acquisition with nearly isotropic resolution has been employed. See, for example, the publications to Harms and Muschler, "Three-dimensional MR Imaging of the Knee using Surface Coils", *Journal of Computer Assisted Tomography;* 10(5): 773-777 (1986) and C. Sherry et al., "Spinal MR imaging: Multiplanar Representation from a Single High Resolution 3D Acquisition", *Journal of Computer Assisted Tomography;* 11(5): 859-862 (1987). While the images produced by this method had high resolution and good T1-weighted contrast, the images also suffered from a long scan time and lack of fluid enhancement.

Variations of fast scan sequences such as the "gradient refocused acquisition in a steady state" (or "GRASS") imaging method have been used to reduce the overall scan time of a 3D exam. See, for example, the publications to Robert L. Tyrrell, "Fast Three-dimensional MR Imaging of the Knee: Comparison with Arthroscopy", *Radiology;* 166: 865-872 (1988): Charles E. Spritzer, et al., "MR Imaging of the Knee: Preliminary Results with a 3DFT GRASS Pulse Sequence", *American Journal of Roentology;* 150: 597-603 (1987); Allan M. Haggar, et al., "Meniscal Abnormalities of the Knee: 3DFT Fast-Scan GRASS MR Imaging", *American Journal of Roentology;* 150: 1341-1344 (1988). However, the images produced by these fast scan sequences are limited by reduced contrast. For example, the soft tissue anatomy around the knee was often lost due to poor contrast between fluid, muscle, and fat and the hyaline cartilage and fluid were often indistinguishable. As a result, the contrast available for diagnosis of ligamentous and mensical injuries is not comparable to the contrast available on conventional spin echo images. Furthermore, chemical shift and magnetic susceptibility effects are more severe, thereby further compromising image quality. Finally, the signal-to-noise (or "SNR") of such 3D methods was limited compared to 2D methods because of the very thin sections employed to get nearly isotropic 3D data sets.

Another fast 3D magnetic imaging resonance technique of interest recently is generally referred to as a fast, low angle (or "FLASH") imaging method. See, for example, the publications to Jens Frahm, et al., "Rapid Three-Dimensional MR Imaging Using the FLASH Technique", *Journal of Computer Assisted Tomography,* 10(2); 363-368 (1986) and A. Haase, et al., "FLASH Imaging. Rapid NMR Imaging Using Low Flip-Angle Pulses", *Journal of Magnetic Resonance,* 67, 258-266 (1986). The publication to Haase et al discloses a FLASH magnetic resonance imaging technique using a slice selective RF pulse with flip angles on the order of 15 degrees. The publication to Frahm et al discloses a FLASH magnetic resonance imaging technique having an image acquisition time of 4 minutes for a 3D data set of dimensions 128×128×128 pixels. Data was acquired using a non-composite, nonselective RF excitation pulse with a flip angle of the order of 15 degrees. A pair of perpendicular phase encoding gradients were generated in the presence of a negative read gradient and an observed magnetic resonance signal was detected in the form of a full symmetric field echo having an echo time of approximately 9 milliseconds which was generated by reversing the read gradient. Reconstruction of the 3D image was performed by conventional 3D Fourier transformation.

It is an object of this invention to provide a method for producing fast, high resolution MR images using three dimensional imaging techniques.

It is another object of this invention to provide a method for producing fast, high resolution gradient echo images having good T1 contrast, a high signal to noise ratio and minimized susceptibility artifacts.

It is yet another object of this invention to provide a method for producing fast, high resolution gradient echo images by minimizing echo times.

SUMMARY OF THE INVENTION

In one aspect, the present invention is a method for imaging the interior of a three dimensional object having an x-axis, a y-axis and a z-axis. First, a uniform magnetic field is generated to magnetize the object to be imaged. First, second, and third changing magnetic fields are then generated along the x-axis, the y-axis and the z-axis, respectively. A series of non-selective composite hard RF pulses are generated to produce transverse magnetization within the object and a series of gradient echoes are received in response to the generated composite RF pulses. An image of the object is then produced from the series of received gradient echoes.

In another aspect, the present invention is a method for imaging the interior of a three dimensional object having a first axis, a second axis, and a third axis by generating a uniform magnetic field to magnetize the object, a non-selective hard RF pulse along the first axis to produce transverse magnetization within the object, phase encoding pulses along the first and third axes, respectively, and a frequency encoding pulse comprised of a de-phasing portion and a re-phasing portion along the second axis. When the frequency encoding pulse enters its re-phasing portion, an asymmetrical fractional gradient echo containing information related to the object being imaged is produced. A next asymmetrical fractional gradient echo is then produced for next phase encoding pulses along the first and third axes. After an asymmetrical fractional gradient echo is produced for all phase encoding pulses, an image of the object is produced from the series of produced asymmetrical fractional gradient echoes.

In still another aspect, the present invention is a method for producing a fast, high SNR image of a knee. A series of non-selective hard RF pulses of a duration approximately equal to 200 milliseconds are generated along a first axis in the presence of a uniform magnetic field. A first series of phase encoding pulses, a second series of phase encoding pulses and the de-phasing portions of a series of frequency encoding pulses are simultaneously generated along the first axis, a third axis and a second axis, respectively. A series of asymmetrical fractional gradient echoes are produced during the re-phasing portion of the frequency encoding pulses and an image of the knee is produced from the series of asymmetrical fractional gradient echoes.

In yet another aspect, the present invention is a method of producing a fast, high SNR image of a brain. A series of spoiler pulses are first generated along a first axis to produce T1 contrast in the image to be produced. A series of non-selective hard RF pulses having a twenty degree flip angle are then generated along a first axis in the presence of a uniform magnetic field. A first series of phase encoding pulses, a second series of phase encoding pulses and the dephasing portions of a series of frequency encoding pulses are simultaneously generated along the first axis, a third axis and a second axis, respectively. A series of asymmetrical fractional gradient echoes are produced during the re-phasing portion of the frequency encoding pulses and an image of the brain is produced from the series of asymmetrical fractional gradient echoes.

In still yet another aspect, the present invention is a method of producing a fast, high SNR image of a cervical spine. A series of slice selective sinc RF pulses produced by simultaneously generating a series of sinc RF pulses and a series of pulses along a first axis are generated in the presence of a uniform magnetic field. A first series of phase encoding pulses, a second series of phase encoding pulses and the de-phasing portions of a series of frequency encoding pulses are simultaneously generated along the first axis, a third axis and a second axis, respectively. A series of asymmetrical fractional gradient echoes having an echo time TE of approximately 5.2 milliseconds are produced during the rephasing portion of the frequency encoding pulses by appropriate shaping of the de-phasing and re-phasing portions of the phase encoding pulses. An image of the cervical spine is then produced from the series of asymmetrical fractional gradient echoes.

BRIEF DESCRIPTION OF THE DRAWINGS

The present invention may be better understood, and its numerous objects, features and advantages become apparent to those skilled in the art by referencing the accompanying drawings in which:

FIG. 3e is a schematic diagram of an echo sequence produced by the generation of the pulse sequences of FIGS. 3b-d in the presence of the transverse magnetization produced by the pulse sequence of FIG. 3a;

FIG. 4e is a schematic diagram of an echo sequence produced by the generation of the pulse sequences of FIGS. 4b-d in the presence of the transverse magnetization produced by the pulse sequence of FIG. 4a;

DETAILED DESCRIPTION OF THE INVENTION

Figure 1:
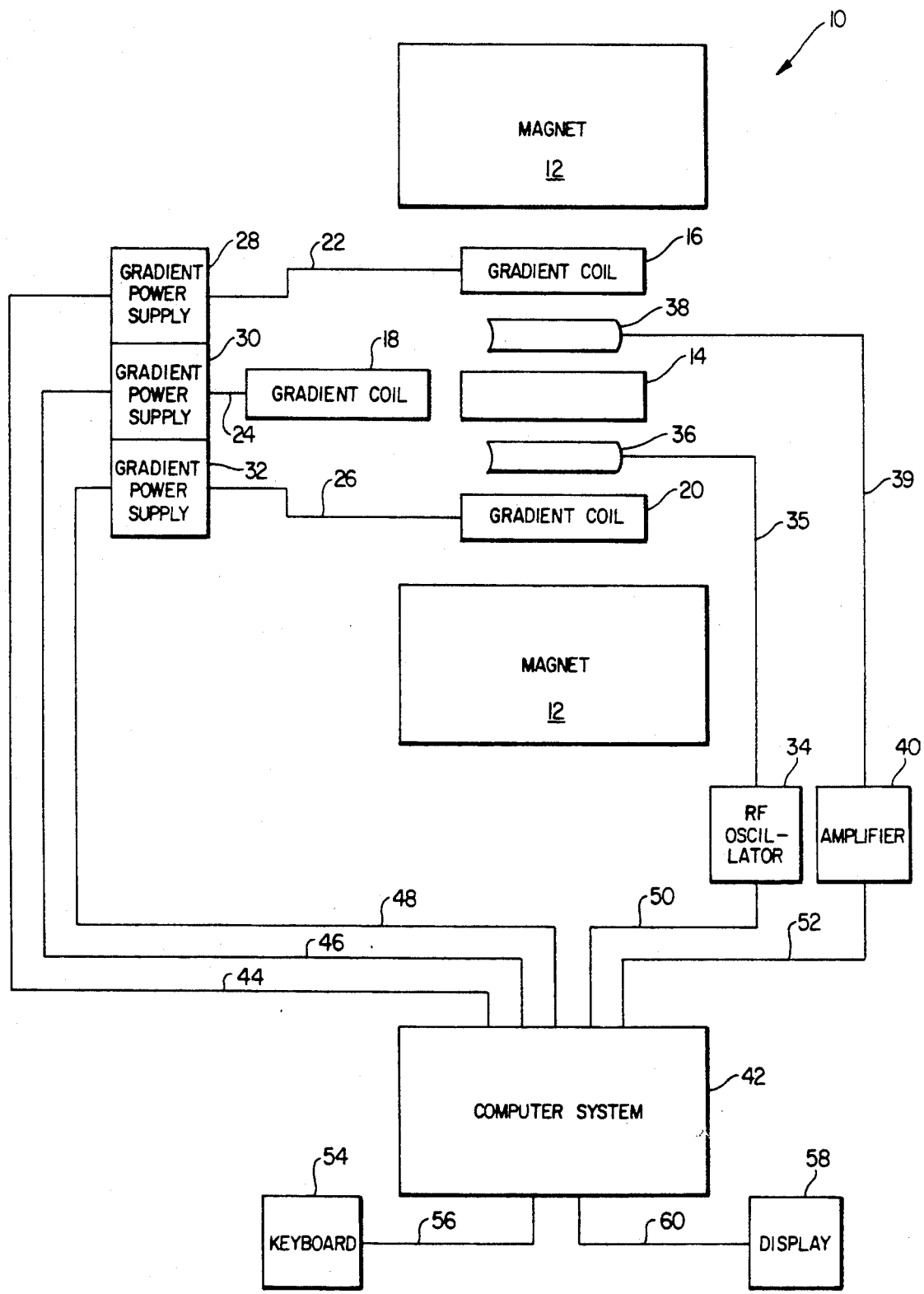
FIG. 1 is a block diagram of an apparatus for producing images of an object using magnetic resonance imaging techniques.

Referring first to FIG. 1, a magnetic resonance imaging system for use in conjunction with the teachings of the present invention shall now be described. As is well known in the art, MR imaging requires a strong, uniform, and stable magnetic field to magnetize the object being imaged. Accordingly, a magnetic resonance (or "MR") imaging system 10 is provided with a magnet 12, for example a superconducting magnet, for generating the aforementioned strong, uniform and stable magnetic field required for magnetizing an object 14 which is to be imaged. As magnetic imaging also requires rapidly changing weak magnetic field gradients along the x, y and z axis, the MR imaging system 10 is further provided with a first set of resistive or gradient coils 16 for generating a rapidly changing, weak magnetic field gradient along the x axis, a second set of gradient coils 18 for generating a rapidly changing, weak magnetic field gradient along the y axis, and a third set of gradient coils 20 for generating a rapidly changing, weak magnetic field gradient along the z axis. Each gradient coil set 16, 18, 20 may be, for example, two coils, each with currents flowing in a direction opposite to that in the other. Preferably each gradient coil set 16, 18, 20 is configured to generate a gradient in a volume at the center of the coil set. The first, second and third gradient coil sets 16, 18, 20 are driven by a respective gradient power supply 28, 30, 32 connected to the corresponding gradient coil set 16, 18, 20 by an electrical connector 22, 24, 26, respectively, of conventional design. Preferably, each gradient coil subsystem 16, 22 and 28, 18, 24 and 30, 20, 26 and 32 should be configured to generate a 10 mT/m or greater gradient magnetic field controllable within precise limits and with rise times of 1 msec or better.

As MR imaging further requires the generation of a radiofrequency (or "RF") field to excite nuclear spins, the MR imaging system 10 further includes a low power RF oscillator 34 capable of amplitude and phase modulation as well as frequency changes required to meet imaging needs, an RF transmitter coil 36 which surrounds the object being imaged, and an RF receiver coil 38 which also surrounds the sample but which is orthogonal with respect to the RF transmitter coil 36. As the RF magnetic field generated by the RF transmitter coil 36 must be 90 degrees to the main field generated by the magnet, the shape of the RF transmitter coil may be varied according to the direction of the main magnetic field with respect to the axis of the object 14. The RF oscillator 34 supplies RF power to the RF transmitter coil 36 via an electrical connector 35 where the RF magnetic field is transmitted into the object 14 for exciting spins. Echoes are detected by the RF receiver coil 38, and transmitted via an electrical connecter 39 to a low noise electronic amplifier 40 for digitization of the detected echoes. The RF field and echoes may be acquired using the 1.5 T Signa Scanner with a transmit-receive extremity coil, both of which are manufactured by General Electric Medical Systems of Milwaukee, Wis.

The first, second and third gradient coil systems 16, 22 and 28, 18, 24 and 30, and 20, 26 and 32, as well as the RF transmitter coil 36 and the RF receiver coil 38 are controlled by a computer system 42 via a corresponding electrical connector 44, 46, 48, 50, and 52, respectively. Typically, the computer system 42 will include a sequence control means for generating first, second and third voltage wave forms for transmission to the first, second, and third gradient power supplies 28, 30 and 32 where first, second, and third gradient magnetic pulse sequences corresponding to the voltage wave forms are produced for transmission by the first, second, and third gradient coil sets 16, 18, and 20. The computer system 42 will further include means for generating an RF pulse sequence for transmission to the RF oscillator 34. Finally, the computer system 42 will also include data processing means for performing conventional data processing techniques such as Fourier transforms, data filtering and data storage function. The computer system 42 is connected to an operator console 54, for example, a keyboard of conventional design, by an electrical connector 56 and display means 58, for example a CRT of conventional design, by an electrical connector 60. The operator console controls the production of an image of the object 14 through the computer system 42 as well as the display of the produced image by the display means 58. A computer system 42, operator console 54 and display means 58 which shall be satisfactory for the uses contemplated herein may be provided by a Model 3/260 or Model 3/160 workstation equipped with TAAC accelerator boards manufactured by Sun Microsystems of Mountain View, Calif. Furthermore, if direct filming of the images displayed on the display means 58 are desired, a 35 mm camera may be used to photograph the displayed images.

Figure 2:
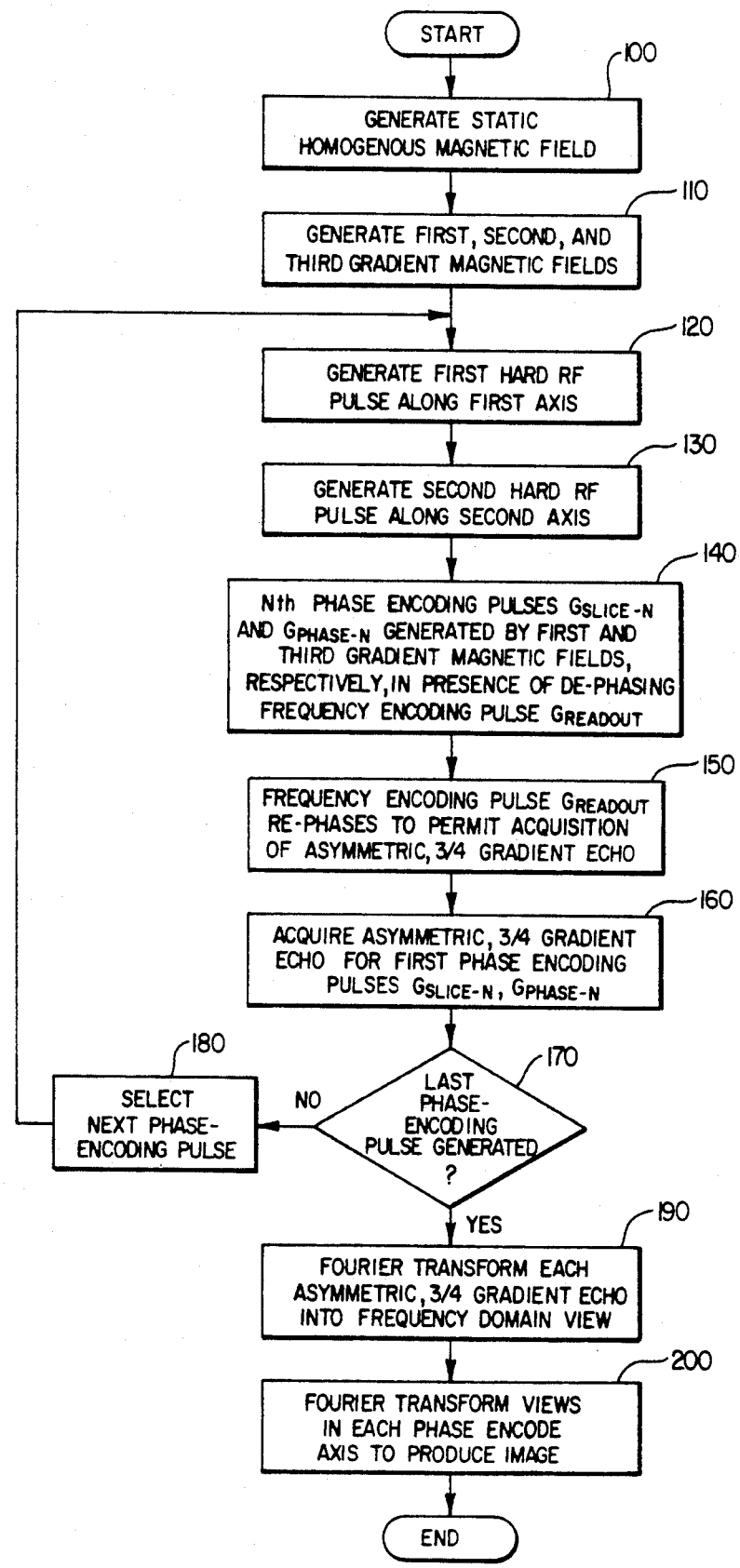
FIG. 2 is a flow chart of a method of producing images of an object using the method of magnetic resonance imaging which is the subject of the present invention.
Figure 3A:
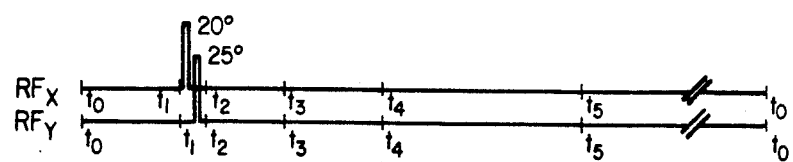
FIG. 3a is a schematic diagram of a pulse sequence generated to produce transverse magnetization within an object to be imaged in accordance with the magnetic resonance imaging technique subject of the present invention.
Figure 3B:
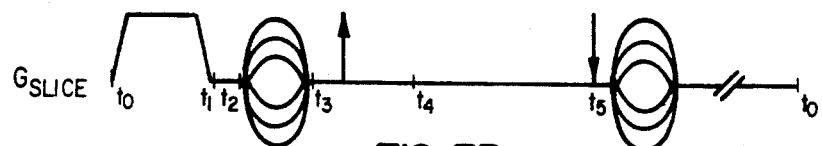
FIG. 3b is a schematic diagram of a first phase encoding pulse sequence to be generated along a first axis.
Figure 3C:
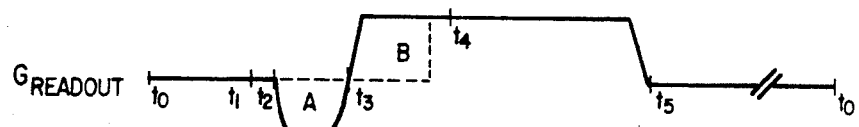
FIG. 3c is a schematic diagram of a first frequency encoding pulse sequence to be generated along a second axis.
Figure 3D:
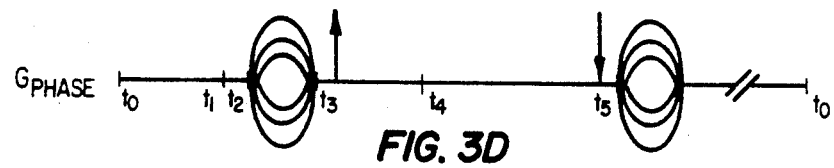
FIG. 3d is a schematic diagram of a second phase encoding pulse sequence to be generated along a third axis.
Figure 3E:
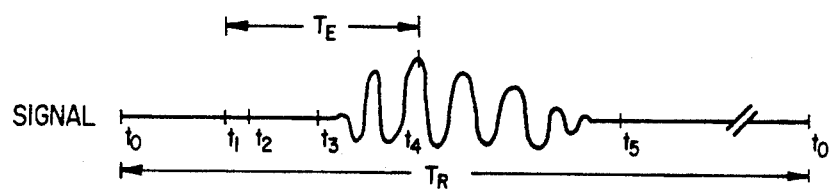
Figure 4A:
FIG. 4a is a schematic diagram of a pulse sequence generated to produce transverse magnetization within an object in accordance with a GRASS magnetic resonance imaging technique.
Figure 4B:
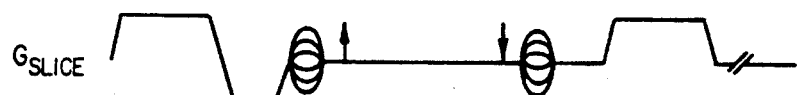
FIG. 4b is a schematic diagram of a first phase encoding pulse sequence to be generated along a first axis.
Figure 4C:
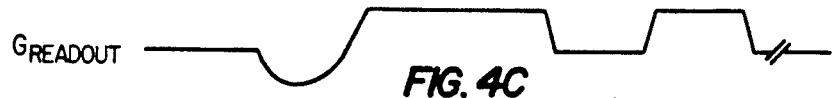
FIG. 4c is a schematic diagram of a first frequency encoding pulse sequence to be generated along a second axis.
Figure 4D:
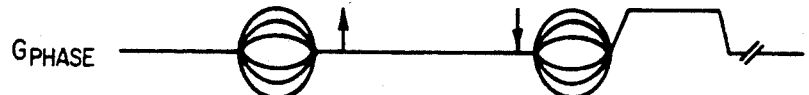
FIG. 4d is a schematic diagram of a second phase encoding pulse sequence to be generated along a third axis.
Figure 4E:
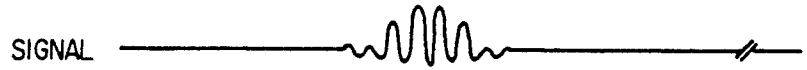

Referring next to FIG. 2, the method of producing a three dimensional image of an object in accordance with the teachings of the present invention shall now be described. Assuming that the center of the object 14 being imaged is the origin of a Cartesian coordinate system, a static homogenous magnetic field directed along the z axis of the Cartesian coordinate system is generated at step 100. Proceeding to step 110, gradient magnetic fields are generated along the z, as well as the x and y, axis of the Cartesian coordinate system. As to be more fully described herein, the generated gradient magnetic fields are a first phase encoding gradient magnetic field directed along the x axis which is hereafter referred to as the $G_{SLICE}$ gradient magnetic field, a frequency encoding gradient magnetic field directed along the y axis which is hereafter referred to as the $G_{READOUT}$ gradient magnetic field, and a second phase encoding gradient magnetic field directed along the z axis which is hereafter referred to as the $G_{PHASE}$ gradient magnetic field.

Proceeding to step 120, an RF pulse sequence is applied to generate transverse magnetism. In one embodiment of the i.e. generated in the absence of a slice selective gradient, composite hard RF pulse comprised of a first non-selective hard RF pulse generated in a first axis and a second non-selective hard RF pulse generated in a second axis. In another embodiment of the invention, the applied RF pulse sequence may be comprised of the first non-selective hard RF pulse generated in the first axis only. In yet another embodiment of the invention, the applied RF pulse sequence may be comprised of the second non-selective hard RF pulse generated in the second axis only.

Accordingly, at step 120, a non-selective hard RF pulse sequence is used to generate transverse magnetism. More specifically, the RF transmitter coil 36 creates transverse magnetism by evolving a first RF magnetic field pulse sequence in the absence of additional magnetic field gradients and in the presence of the uniform magnetic field. Preferably, the first RF pulse sequence is comprised of a nonselective hard RF pulse applied for 200 microseconds along the x axis and having a flip angle of twenty degrees and a repetition time $T_R$ between successive pulses of 16 milliseconds. In one embodiment of the invention, the tip angle of the x-axis pulse may be adjusted to produce a T1 weighted image for the desired muscle, fat, meniscus and hyaline cartilage contrast.

Proceeding to step 130, the RF transmitter coil 36 creates additional transverse magnetism by evolving a second RF magnetic field pulse sequence in the absence of additional magnetic field gradients and in the presence of the uniform magnetic field gradients. Preferably, the second RF pulse sequence is comprised of a nonselective hard RF pulse applied for 250 microseconds along the y axis and having a flip angle of twenty-five degrees and a repetition time $T_R$ of 16 milliseconds. The hard pulse along the y-axis is generated to eliminate residual off resonance longitudinal magnetization that is not effectively spoiled with conventional gradient spoiler pulses. When applied in a steady state, the composite hard RF pulse, which is comprised of the first hard RF pulse along the first axis together with the second hard RF pulse along the second axis, results in increased transverse magnetization when compared to a single RF pulse conventional gradient echo. Furthermore, by generating non-selective, composite hard RF pulses, echo artifacts such as those resulting from residual non-resonant longitudinal magnetization are reduced and the signal to noise ratio (or "SNR") is improved over conventional gradient echo sequences with similar parameters.

Proceeding to step 140, a first phase encoding pulse $G_{SLICE-1}$ along the slice axis and a first phase encoding pulse $G_{PHASE-1}$ along the phase axis are generated as part of the $G_{SLICE}$ and $G_{PHASE}$ gradients to be more fully described with respect to FIG. 3. The first phase encoding pulses $G_{SLICE-1}$ and $G_{PHASE-1}$ correspond to the application of the phase encoding gradients full force in a positive direction along the slice and phase axes, respectively. For successive phase encoding pulses $G_{SLICE-N}$ and $G_{PHASE-N}$, the respective phase encoding gradients are applied with successively less strength until, during the middle phase encoding pulses, the phase encoding gradients are turned off and during the last phase encoding pulses, the phase encoding gradients are applied full force in a negative direction along the slice and phase axes, respectively.

During the generation of the phase encoding pulses $G_{SLICE-1}$ and $G_{PHASE-1}$, the $G_{READOUT}$ frequency encoding pulse is negative, thereby de-phasing the spins. At step 150, the $G_{READOUT}$ frequency encoding pulse goes positive, thereby permitting the acquisition of a gradient echo for the first phase encoding pulses $G_{SLICE-1}$ and $G_{PHASE-1}$ and, at step 160, the acquisition of a first gradient echo by the RF receiver coil 38 is completed. While echoes having echo times TE as short as 2.6 msec may be acquired in accordance with the teachings of the present invention, the acquired gradient echoes are preferably asymmetric, $\frac{3}{4}$ fractional gradient echoes with a TE of 4.6 milliseconds. The 4.6 millisecond echo time is preferred because, since fat and water are in-phase at 4.6 milliseconds, such a TE will reduce the chemical shift effects of the gradient echo.

Proceeding to step 170, it is determined whether the last phase-encoding pulse, i.e. a phase-encoding pulse at full force in the negative direction along the slice and phase axes, has been generated. If it is determined that the last phase-encoding pulse has not been generated, a next phase-encoding pulse along the slice axis and a next phase-encoding pulse along the phase axis are selected at step 180. The method of the present invention then returns to step 120 for the generation of a next composite hard RF pulse. If it is determined at step 170 that echoes corresponding to full force phase-encoding pulse in the negative direction along the slice and phase axes have been received, data acquisition is completed and the method of the present invention proceeds to step 190 for processing of the acquired data.

Typically, the acquired data may be viewed as a matrix of dimensions $128 \times 128 \times 512$. This viewing matrix corresponds to a field of view of 19.2 cm in the slice phase encoded direction, 14 cm in the phase phase encoded direction and 14 cm in the frequency encoded readout direction. At step 190, therefore, the acquired data matrix is processed to determine the signal intensity at each location, thereby producing an image of the object by the application of well known Fourier transform data processing techniques. Accordingly, the data matrix is transformed into a series of frequency data views in the frequency domain by applying a first series of Fourier transforms in the time direction. At step 200, an image of the object is produced by applying a second and third series of Fourier transforms in the slice phase encode direction and in the phase phase encode direction. Preferably, the frequency domain should be over-sampled to avoid aliasing data.

Referring next to FIGS. 3a-e, the three dimensional magnetic image resonance imaging technique subject of the present invention shall be more fully described. More specifically, at time $t_0$, a spoiler pulse is applied along the slice axis to spoil the steady state RF generated spin echo. At time $t_1$, the spoiler pulse ends and a 20 degree hard RF pulse is generated along the x axis for 200 milliseconds followed by a 25 degree hard RF pulse along the y axis for 250 milliseconds. The hard pulses are completed at time $t_2$. Phase encoding pulses $G_{SLICE}$ and $G_{PHASE}$ are generated and frequency encoding pulse $G_{READOUT}$ goes negative to de-phase the spins. At time $t_3$, phase encoding pulses $G_{SLICE}$ and $G_{PHASE}$ are completed and frequency encoding pulse $G_{READOUT}$ goes positive, thereby re-phasing the spins and commencing acquisition of a gradient echo. The $G_{READOUT}$ pulse continues positive until, at time $t_4$, the area A under the READOUT axis between times $t_2$ and $t_3$ is equal to the area B above the READOUT axis between times $t_3$ and $t_4$. At time $t_4$, the acquired echo pulse is at its maximum amplitude. By adjusting the $G_{READOUT}$ gradient pulse sequence to the shape illustrated in FIG. 3, the acquired pulse is shaped into the desired asymmetrical echo. At time $t_5$, the frequency encoding $G_{READOUT}$ pulse sequence returns to zero, thereby ending the acquisition of the echo. Rewinder gradients are then applied along the slice and phase axes. Typically, the rewinder gradients should have a magnitude equal to the phase encoding pulses $G_{SLICE}$ and $G_{PHASE}$ and generated in the opposite direction thereto. The sequence then repeats at $t_0$ for a next pair of phase encode pulses. The relaxation time TR separating successive $t_0$ while maintaining a steady state should be minimized as much as possible to reduce scanning time required to produce an image. Accordingly, the relaxation time is preferably 16 msec and the total scan time shall be approximately nine minutes.

Referring next to FIGS. 4a-e a schematic diagram of an imaging sequence produced in accordance with a conventional GRASS magnetic resonance imaging technique is illustrated for comparison purposes. In contrast with the imaging sequence of the present invention, the GRASS techniques applies a slice selective RF sinc pulse which has a 3200 microsecond duration. The flip angle ranges from twenty to forty degrees and a symmetrical, full gradient echo is produced.

Figure 5:
FIG. 5 is an image of a knee produced in accordance with the magnetic resonance imaging sequence of FIGS. 2 and 3.
Figure 6:
FIG. 6 is an image of a knee produced in accordance with the GRASS magnetic resonance imaging sequence of FIG. 4.

Referring next to FIGS. 5 and 6, an image produced by the imaging techniques subject of the present invention and schematically illustrated in FIG. 3 and an image produced the GRASS imaging technique schematically illustrated in FIG. 4 shall now be described. As may be clearly seen, image contrast is improved by the generation of an image in accordance with the teachings of the present invention. Fat, bone marrow, hyaline cartilage, meniscus, ligament, tendon, and joint fluid are all clearly seen in FIG. 5.

The methods of the present invention have numerous applications in medical diagnostic techniques. For example, the present invention has been particularly useful in the diagnosis of internal derangements of the knee. Preferably, the parameters for knee imaging in accordance with the teachings of the present invention are TE=4.6 milliseconds, TR=16.3 milliseconds, and a composite hard RF pulse sequence comprised of a series of first hard RF pulses having a twenty degree flip angle and generated along the x-axis and a series of second hard RF pulses having a twenty-five degree flip angle and generated along the y-axis. The received gradient echo should be asymmetrically shaped. In a still further preferred embodiment, a rewinder pulse is generated along the slice phase encode and phase encode axes after the frequency encode pulse is completed.

The present invention has also been useful for internally examining the brain. Preferably, the parameters for brain imaging in accordance with the teachings of the present invention are TE=4.6 milliseconds, TR=33 milliseconds, and a composite hard RF pulse sequence comprised of a series of first hard RF pulses having a twenty degree flip angle and generated along the x-axis and a series of second hard RF pulses having a twenty-five degree flip angle and generated along the y-axis. In this embodiment, the generation of the spoiler pulse is preferred so that the large T2 coherence may be spoiled and to achieve the desired T1 contrast. The received gradient echo should be asymmetrically shaped. In a still further preferred embodiment, a rewinder pulse is generated along the slice phase encode and phase phase encode axes after the frequency encode pulse is completed.

The present invention has been useful for internally examining the cervical spine as well. Preferably, the parameters for cervical spine imaging in accordance with the teachings of the present invention are TE=5.2 milliseconds, TR=33 milliseconds, and a slice selective sinc RF pulse sequence having a twenty degree flip angle. The use of slab selection gave lower SNR than a composite hard RF pulse but was necessary to prevent wrap from the shoulders. In this embodiment, the generation of a small constant spoiler is preferred. Again, the received gradient echo should be asymmetrically shaped. In a still further preferred embodiment, a rewinder pulse is generated along the slice phase encode and phase phase encode axes after the frequency encode pulse is completed.

As can be seen from the above description of the present invention, there is provided an improved method of imaging an object using magnetic resonance techniques. By providing a composite hard RF pulse consisting of a first hard RF pulse having a 200 microsecond duration along the x axis followed by a second hard RF pulse having a 250 microsecond duration along the y axis, the transverse magnetization excitation period is much shorter than the 3200 microsecond sinc RF pulse typically used in conventional GRASS imaging techniques. Furthermore, by combining a short composite hard RF pulse with a frequency encoding gradient shaped to produce an asymmetric, $\frac{3}{4}$ fractional gradient echo, a faster method of 3D MR imaging technique is provided. Finally, the faster production of asymmetric $\frac{3}{4}$ fractional gradient echoes permits the echo time to be adjusted to 4.6 msec, the shortest echo time for which fat and water are in phase, thus providing improved image contrast in combination with faster image production.

However, those skilled in the art will recognize that many modifications and variations besides those specifically mentioned may be made in the techniques described herein without departing substantially from the concept of the present invention. Accordingly, it should be clearly understood that the form of the invention described herein is exemplary only and is not intended as a limitation on the scope of the invention.

What is claimed is:

1. A method of producing an image of the interior of a three dimensional object having an x-axis, a y-axis and a z-axis using magnetic resonance comprising the steps of:

generating a uniform magnetic field to magnetize said object;

generating a first, second, and third changing magnetic field along said x-axis, said y-axis and said z-axis, respectively;

generating a series of non-selective composite hard RF pulses to produce transverse magnetization within said object, said series of non-selective composite hard RF pulses including at least one pulse generated along a first axis and at least one pulse generated along a second axis;

receiving a series of gradient echoes in response to said generated composite RF pulses; and producing an image of said object from said series of received gradient echoes.

2. A method of magnetic resonance imaging as set forth in claim 1 wherein the step of generating said series of non-selective composite hard RF pulses further comprises the step of generating a first series of hard RF pulses, each having a flip angle of approximately twenty degrees, along said x-axis.

3. A method of magnetic resonance imaging as set forth in claim 2 wherein said twenty degree hard RF pulses are generated along said x-axis for approximately 200 microseconds.

4. A method of producing an image of the interior of a three dimensional object having an x-axis, a y-axis and a z-axis using magnetic resonance comprising the steps of:

generating a uniform magnetic field to magnetize said object;

generating a first, second, and third changing magnetic field along said x-axis, said y-axis and said z-axis, respectively;

generating a series of non-selective composite hard RF pulses to produce transverse magnetization within said object;

producing asymmetric fractional echoes in response to said generation of said non-selective composite hard RF pulses;

receiving said asymmetric fractional echoes produced in response to said generation of said non-selective composite hard RF pulses; and producing an image of said object from said series of received asymmetric fractional echoes.

5. A method of magnetic resonance imaging as set forth in claim 4 wherein said y axis is the readout axis and wherein the step of generating said second changing magnetic field along said second axis further comprises the step of generating a readout gradient which produces said asymmetric fractional echoes in response to said generation of said non-selective composite hard RF pulses.

6. A method of producing an image of the interior of a three dimensional object having an x-axis, a y-axis and a z-axis using magnetic resonance comprising the steps of:

generating a uniform magnetic field to magnetize said object;

generating a first, second, and third changing magnetic field along said x-axis, said y-axis and said z-axis, respectively;

generating a series of non-selective composite hard RF pulses to produce transverse magnetization within said object, said step of generating a series of non-selective composite hard RF pulses including the steps of generating a first series of RF pulses, each having a flip angle of approximately 20 degrees, along said x-axis for approximately 200 microseconds and spoiling non-resonant longitudinal magnetization;

receiving a series of gradient echoes in response to said generated composite RF pulses; and producing an image of said object from said series of received gradient echoes.

7. A method of magnetic resonance imaging as set forth in claim 6 wherein the step of spoiling non-resonant longitudinal magnetization further comprises the step of generating a second series of hard RF pulses, each having a flip angle of approximately twenty-five degrees, along said y-axis.

8. A method of magnetic resonance imaging as set forth in claim 7 wherein said twenty-five degree hard RF pulses are generated along said y-axis for approximately 250 microseconds.

9. A method of producing an image of the interior of a three dimensional object having an x-axis, a y-axis and a z-axis using magnetic resonance comprising the steps of:

generating a uniform magnetic field to magnetize said object;

generating a first, second, and third changing magnetic field along said x-axis, said y-axis and said z-axis, respectively;

generating a series of non-selective composite hard RF pulses to produce transverse magnetization within said object, said series of non-selective composite hard RF pulses including at least one pulse generated along a first axis and at least one pulse generated along a second axis, said step of generating said series of non-selective composite hard RF pulses including the step of generating a first series of hard RF pulses, each having a flip angle of approximately 20 degrees, along said x-axis;

reducing said repetition time TR between the generation of successive composite hard RF pulses;

receiving a series of gradient echoes in response to said generated composite RF pulses; and producing an image of said object from said series of received gradient echoes.

10. A method magnetic resonance imaging as set forth in claim 9 wherein said repetition time between the generation of successive composite hard RF pulses is approximately 16 milliseconds.

11. A method of magnetic resonance imaging of the interior of a three dimensional object having a first axis, a second axis, and a third axis, comprising the steps of:

generating a uniform magnetic field to magnetize said object;

generating a first non-selective hard RF pulse along said first axis to produce transverse magnetization within said object;

generating a first phase encoding pulse along said first axis;

generating a first phase encoding pulse along said third axis;

generating a frequency encoding pulse along said second axis, said frequency encoding pulse comprised of a de-phasing portion and a re-phasing portion, said first phase encoding pulse, said second phase encoding pulse and said de-phasing portion of said frequency encoding pulse generated simultaneously;

producing an asymmetrical fractional gradient echo containing information related to said object being imaged, said asymmetrical fractional gradient echo produced during said re-phasing portion of said frequency encoding pulse;

selecting a next phase encoding pulse along said first axis and a next phase encoding pulse along said third axis;

repeating said steps of generating a first non-selective hard RF pulse along said first axis, simultaneously generating said next phase encoding pulses along said first and third axes and said de-phasing portion of said frequency encoding pulse along said second axis, and producing a next asymmetrical fractional gradient echo containing information related to said object being imaged until an asymmetrical fractional gradient echo corresponding to last phase encoding pulses along said first and third axes has been produced; and producing an image of said object from said series of produced asymmetrical fractional gradient echoes.

12. A method of magnetic resonance imaging as set forth in claim 11 wherein said de-phasing and re-phasing portions of said frequency encoding pulse are shaped to produce said asymmetrical fractional gradient echoes.

13. A method of magnetic resonance imaging as set forth in claim 12 wherein the step of producing an asymmetrical fractional gradient echo further comprises the step of producing an asymmetrical fractional gradient echo which reduces chemical shift effects of said produced gradient echo.

14. A method of magnetic resonance imaging as set forth in claim 13 wherein said de-phasing and re-phasing portions of said frequency encoding pulse are further shaped such that the echo time TE between said generated RF pulse and said produced gradient echo is 4.6 milliseconds, thereby placing fat and water in phase.

15. A method of magnetic resonance imaging as set forth in claim 14 wherein said generated non-selective hard RF pulses are applied along said first axis for 200 microseconds.

16. A method of magnetic resonance imaging as set forth in claim 15 further comprising the step of generating a spoiler pulse along said first axis before each phase encoding pulse, thereby spoiling steady state RF generated spin echo.

17. A method of magnetic resonance imaging as set forth in claim 16 further comprising the step of generating a second non-selective hard RF pulse along said second axis for 250 microseconds, said first and second non-selective hard RF pulses defining a composite hard RF pulse.

18. A method of magnetic resonance imaging as set forth in claim 17 further comprising the step of simultaneously generating rewinding phase encoding pulses along said first and third axes after removal of said frequency encoding pulse along said second axis.

19. A method of magnetic resonance imaging as set forth in claim 18 wherein the step of producing an image of said object from said series of produced asymmetrical fractional gradient echoes further comprises the steps of:
applying a first Fourier transform to each of said produced echoes to transform each of said produced echoes into frequency domain data; and
applying second and third Fourier transforms to said transformed frequency domain data along said first and third axes.

20. A method of magnetic resonance imaging as set forth in claim 19 further comprising the step of oversampling in said frequency domain to avoid aliasing of said data.

21. A method of producing a fast, high SNR image of a knee comprising the steps of:
generating a uniform magnetic field;
generating a first series of non-selective hard RF pulses of a duration approximately equal to 200 microseconds along a first axis;
generating a series of phase encoding pulses along said first axis;
generating a series of phase encoding pulses along a third axis;
generating a series of frequency encoding pulses along a second axis, each of said frequency encoding pulses comprised of a de-phasing portion and a re-phasing portion, said first phase encoding pulses, said second phase encoding pulses and said de-phasing portions of said frequency encoding pulses generated simultaneously;
producing a series of asymmetrical fractional gradient echoes during said re-phasing portion of said frequency encoding pulses; and
producing an image of said knee from said series of produced asymmetrical fractional gradient echoes.

22. A method for imaging a knee as set forth in claim 21 wherein said de-phasing and re-phasing portions of said phase encoding pulse are shaped such that the echo time TE between said generated RF pulse and said produced gradient echo is 4.6 milliseconds, thereby placing the fat and water components of said knee in phase.

23. A method for imaging a knee as set forth in claim 22 further comprising the step of adjusting the tip angle of said first series of non-selective hard RF pulses along said first axis to produce a T1 weighted image for the muscle, fat, meniscus and hyaline cartilage contrast of said knee.

24. A method for imaging a knee as set forth in claim 23 further comprising the step of generating a second non-selective series of hard RF pulses of a duration approximately equal to 250 microseconds along said second axis, said first and second series of non-selective hard RF pulses defining a series of composite hard RF pulses.

25. A method for imaging a knee as set forth in claim 24 further comprising the step of selecting a repetition time TR of approximately 16.3 milliseconds between successive composite hard RF pulses, thereby achieving a steady-state with reduced artifacts.

26. A method for imaging a knee as set forth in claim 25 further comprising the step of generating a spoiler pulse along said first axis before each phase encoding pulse for said first axis, thereby spoiling steady state RF generated spin echo.

27. A method for imaging a knee as set forth in claim 26 further comprising the step of simultaneously generating rewinding phase encoding pulses along said first and third axes after removal of said frequency encoding pulse along said second axis.

28. A method of magnetic resonance imaging as set forth in claim 26 wherein the step of producing an image of said object from said series of produced asymmetrical fractional gradient echoes further comprises the steps of:
applying a Fourier transform to each of said produced echoes to transform each of said produced echoes into frequency domain data; and
applying second and third Fourier transforms to said transformed frequency domain data along said first and third axes.

29. A method of magnetic resonance imaging as set forth in claim 28 further comprising the step of oversampling in said frequency domain to avoid aliasing of said data.

30. A method of producing a fast, high SNR image of a brain comprising the steps of:
generating a uniform magnetic field;
generating a first series of non-selective hard RF pulses having a twenty degree flip angle along a first axis;
generating a series of spoiler pulses along said first axis to produce T1 contrast;
generating a series of phase encoding pulses along said first axis;
generating a series of phase encoding pulses along a third axis;
generating a series of frequency encoding pulses along a second axis, said frequency encoding pulse comprised of a de-phasing portion and a re-phasing portion, said spoiler pulses generated before said phase encding pulses along said first and third axes, said phase encoding pulses along said first and third axes and said de-phasing portions of said frequency encoding pulses generated simultaneously;
producing a series of asymmetrical fractional gradient echoes during said re-phasing portion of said frequency encoding pulses; and
producing an image of said brain from said series of produced asymmetrical fractional gradient echoes.

31. A method for imaging a brain as set forth in claim 30 wherein said de-phasing and re-phasing portions of said phase encoding pulse are shaped such that the echo time TE between said generated RF pulse and said produced gradient echo is approximately 4.6 milliseconds, thereby placing the fat and water components of said brain in phase.

32. A method for imaging a brain as set forth in claim 31 further comprising the step of generating a second series of non-selective hard RF pulses having a twenty-five degree flip angle along said second axis, said first and second series of non-selective hard RF pulses defining a series of composite hard RF pulses.

33. A method for imaging a brain as set forth in claim 32 further comprising the step of selecting a repetition time TR of approximately 33 milliseconds between successive composite hard RF pulses, thereby achieving a steady-state with reduced artifacts.

34. A method for imaging a brain as set forth in claim 33 further comprising the step of simultaneously generating rewinding phase encoding pulses along said first and third axes after removal of said frequency encoding pulse along said second axis.

* * * * *